(12) United States Patent
Lee et al.

(10) Patent No.: US 9,927,508 B2
(45) Date of Patent: Mar. 27, 2018

(54) MAGNETIC RESONANCE IMAGING APPARATUS AND METHOD FOR OPERATING THE SAME

(71) Applicants: SAMSUNG ELECTRONICS CO., LTD., Suwon-si (KR); INDUSTRY-ACADEMIC COOPERATION FOUNDATION, YONSEI UNIVERSITY, Seoul (KR)

(72) Inventors: Young-yoon Lee, Suwon-si (KR); Do-sik Hwang, Seoul (KR); Tae-joon Eo, Cheongju-si (KR); Jin-seong Jang, Seoul (KR); Hae-kyung Jung, Seongnam-si (KR); Dong-hyun Kim, Seoul (KR); Min-oh Kim, Seoul (KR); Na-rae Choi, Seogwipo-si (KR); Dong-yeob Han, Seoul (KR)

(73) Assignees: SAMSUNG ELECTRONICS CO., LTD., Suwon-si (KR); INDUSTRY-ACADEMIC COOPERATION FOUNDATION, YONSEI UNIVERSITY, Seoul (KR)

(*) Notice: Subject to any disclaimer, the term of this patent is extended or adjusted under 35 U.S.C. 154(b) by 659 days.

(21) Appl. No.: 14/538,163

(22) Filed: Nov. 11, 2014

(65) Prior Publication Data
US 2015/0212176 A1    Jul. 30, 2015

(30) Foreign Application Priority Data

Nov. 11, 2013  (KR) .................. 10-2013-0136385
Aug. 29, 2014  (KR) .................. 10-2014-0114513

(51) Int. Cl.
G01R 33/56  (2006.01)
G01R 33/561  (2006.01)
G01R 33/563  (2006.01)

(52) U.S. Cl.
CPC .... *G01R 33/5619* (2013.01); *G01R 33/56308* (2013.01)

(58) Field of Classification Search
CPC .... G01R 33/5611; G01R 33/50; G01R 33/56; G01R 33/4828; G01R 33/56341;
(Continued)

(56) References Cited

U.S. PATENT DOCUMENTS

2012/0235678 A1   9/2012  Seiberlich et al.
2013/0121554 A1*  5/2013  Liu ..................... G06T 11/005
                                                       382/131
(Continued)

OTHER PUBLICATIONS

Dan Ma et al., "Magnetic resonance fingerprinting", Nature, vol. 495, Mar. 14, 2013, 18 pgs. total.
(Continued)

*Primary Examiner* — Clayton E Laballe
*Assistant Examiner* — Ruifeng Pu
(74) *Attorney, Agent, or Firm* — Sughrue Mion, PLLC

(57) ABSTRACT

Provided is a magnetic resonance imaging (MRI) apparatus. The MRI apparatus includes: a data acquisition unit configured to acquire a first k-space including a first missing line by undersampling an MR signal received from an object at a first time point, acquire a second k-space including a first acquired line corresponding to the first missing line by undersampling an MR signal received from the object at a second time point, and acquire a third k-space including a second acquired line corresponding to the first missing line by undersampling an MR signal received from the object at a third time point; and an image processor configured to interpolate data in the first missing line based on data in the first and second acquired lines.

9 Claims, 8 Drawing Sheets

(58) Field of Classification Search
CPC .............. G01R 33/4818; G01R 33/543; G01R 33/482; G01R 33/54; G01R 33/56308; G06T 11/005; G06T 2207/10088; G06T 2207/20182; G06T 5/001; G06T 5/002
See application file for complete search history.

(56) References Cited

U.S. PATENT DOCUMENTS

| | | | |
|---|---|---|---|
| 2013/0265047 A1 | 10/2013 | Griswold et al. | |
| 2014/0015527 A1* | 1/2014 | Griswold | G01R 33/4826 324/309 |
| 2014/0097845 A1* | 4/2014 | Liu | G01R 33/5611 324/322 |
| 2015/0108985 A1* | 4/2015 | Choi | G01R 33/5611 324/322 |
| 2015/0187073 A1* | 7/2015 | Stemmer | G06T 5/001 382/131 |
| 2015/0198685 A1* | 7/2015 | Grodzki | G01R 33/32 324/309 |
| 2016/0154078 A1* | 6/2016 | Grodzki | G01R 33/50 324/309 |
| 2016/0154079 A1* | 6/2016 | Jellus | G01R 33/5611 324/309 |

OTHER PUBLICATIONS

Y.C. Pati et al., "Orthogonal Matching Pursuit: Recursive Function Approximation with Applications to Wavelet Decomposition", 27th Annual Asilomar Conference on Signals Systems ad Computers, Nov. 1-3, 1993, pp. 1-5.

* cited by examiner (a) (b) (c)

MAGNETIC RESONANCE IMAGING APPARATUS AND METHOD FOR OPERATING THE SAME

RELATED APPLICATIONS

This application claims the benefit of Korean Patent Application No. 10-2013-0136385, filed on Nov. 11, 2013, and Korean Patent Application No. 10-2014-0114513, filed on Aug. 29, 2014, in the Korean Intellectual Property Office, the disclosures of which are incorporated herein in their entireties by reference.

BACKGROUND

1. Field

One or more exemplary embodiments relate to a magnetic resonance imaging (MRI) apparatus and a method of operating the same, and more particularly, to an MRI apparatus adapted to generate accurate MR images based on undersampled data.

2. Description of the Related Art

Magnetic resonance imaging (MRI) creates images by using information determined through the resonance of atomic nuclei exposed to a magnetic field. The resonance of atomic nuclei is a phenomenon where an atomic nucleus in a low energy state absorbs RF energy and is excited to a higher energy state when a specific radio frequency (RF) is incident on the atomic nucleus magnetized by an external magnetic field. Atomic nuclei have different resonant frequencies depending on their types, and the resonance thereof is affected by the intensity of an external magnetic field. The human body includes a large number of atomic nuclei, and hydrogen nuclei are commonly used for MRI.

Recently, research has been conducted on imaging techniques for obtaining MR images in a short time.

SUMMARY

One or more exemplary embodiments include a magnetic resonance imaging (MRI) apparatus adapted to maintain or improve the quality of an MR image while reducing the time required to acquire k-space data.

Additional aspects will be set forth in part in the description which follows and, in part, will be apparent from the description, or may be learned by practice of the presented exemplary embodiments.

According to one or more exemplary embodiments, an MRI apparatus includes: a data acquisition unit configured to acquire a first k-space including a first missing line by undersampling an MR signal received from an object at a first time point, acquire a second k-space including a first acquired line corresponding to the first missing line by undersampling an MR signal received from the object at a second time point, and acquire a third k-space including a second acquired line corresponding to the first missing line by undersampling an MR signal received from the object at a third time point; and an image processor configured to interpolate data in the first missing line based on data in the first and second acquired lines.

The image processor may calculate weights for the second and third k-spaces and interpolates the data in the first missing line based on the calculated weights for the second and third k-spaces.

The image processor may calculate weights for the second and third k-spaces based on n-th line data in the first k-space, n-th line data in the second k-space, and n-th line data in the third k-space.

The pieces of n-th line data in the first through third k-spaces may be center line data therein.

The image processor may calculate the weights for the second and third k-spaces by applying an Orthogonal Matching Pursuit (OMP) algorithm to the center line data in the first through third k-spaces.

The data acquisition unit may acquire the first through third k-space based on first through third values of an MR parameter, respectively.

According to one or more exemplary embodiments, a method of operating an MRI apparatus includes: acquiring a first k-space including a first missing line by undersampling an MR signal received from an object at a first time point; acquiring a second k-space including a first acquired line corresponding to the first missing line by undersampling an MR signal received from the object at a second time point; acquiring a third k-space including a second acquired line corresponding to the first missing line by undersampling an MR signal received from the object at a third time point; and interpolating data in the first missing line based on data in the first and second acquired lines.

The interpolating of the data in the first missing line may include: calculating weights for the second and third k-spaces; and interpolating the data in the first missing line based on the calculated weights for the second and third k-spaces.

In the calculating of the weights for the second and third k-spaces, weights for the second and third k-spaces may be calculated based on n-th line data in the first k-space, n-th line data in the second k-space, and n-th line data in the third k-space.

The pieces of n-th line data in the first through third k-spaces may be center line data therein.

In the calculating of the weights for the second and third k-spaces, the weights for the second and third k-spaces may be calculated by applying an OMP algorithm to the center line data in the first through third k-spaces.

In the acquiring of the first k-space, the first k-space may be acquired based on a first value of an MR parameter. In the acquiring of the second k-space, the second k-space may be acquired based on a second value of the MR parameter. In the acquiring of the third k-space, the third k-space may be acquired based on a third value of the MR parameter.

According to the exemplary embodiments, unsampled data in a current k-space may be efficiently obtained by using sampled data in other k-spaces, and thus a high quality MR image may be generated.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
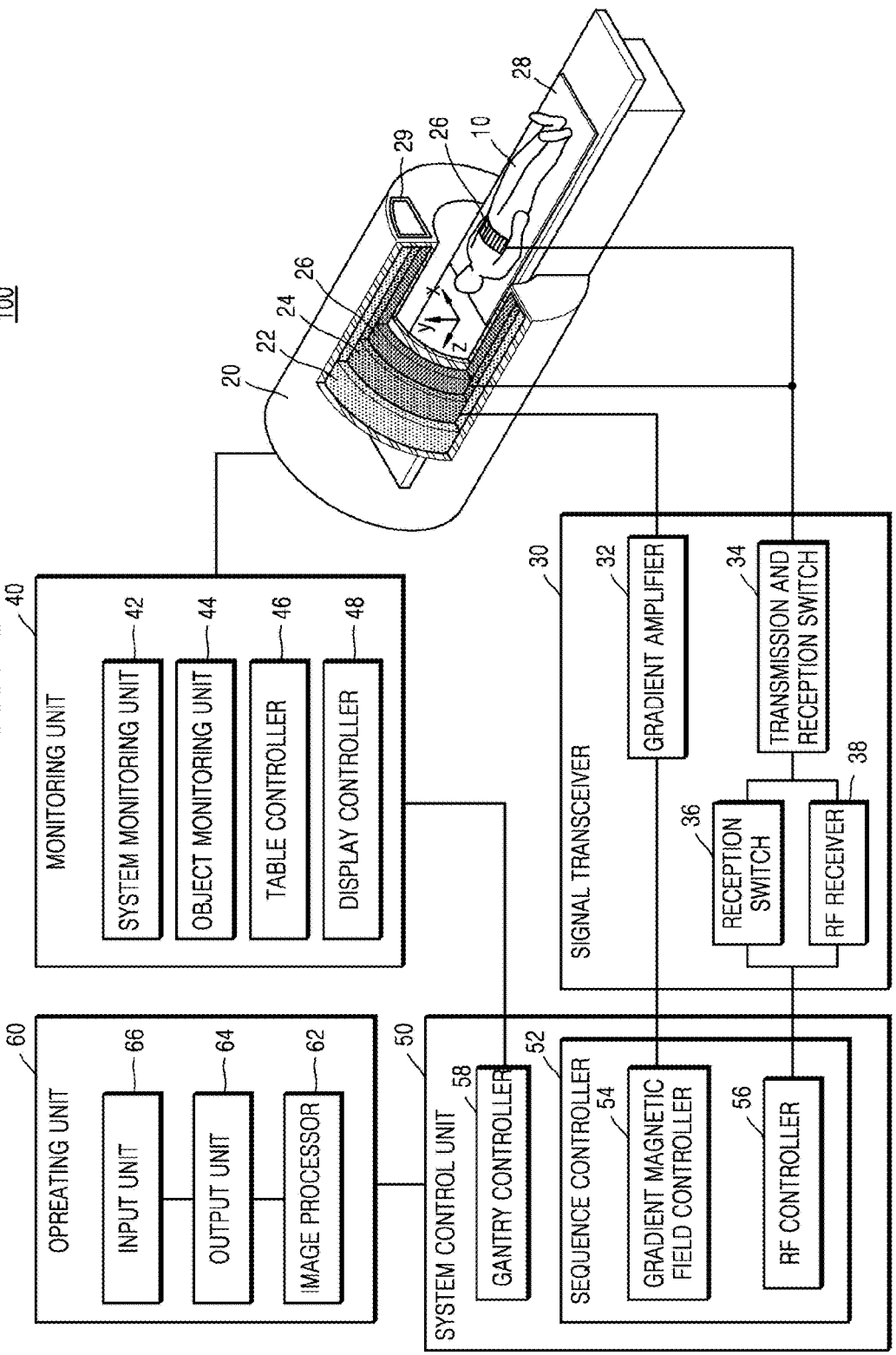
FIG. 1 is a block diagram of a magnetic resonance imaging (MRI) apparatus according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. Expressions such as "at least one of," when preceding a list of elements, modify the entire list of elements and do not modify the individual elements of the list.

Advantages and features of one or more embodiments of the present inventive concept and methods of accomplishing the same may be understood more readily by reference to the following detailed description of the embodiments and the accompanying drawings. In this regard, the present embodiments may have different forms and should not be construed as being limited to the descriptions set forth herein. Rather, these embodiments are provided so that this disclosure will be thorough and complete and will fully convey the concept of the present embodiments to one of ordinary skill in the art, and the present inventive concept will only be defined by the appended claims.

Terms used herein will now be briefly described and then one or more embodiments of the present inventive concept will be described in detail.

All terms including descriptive or technical terms which are used herein should be construed as having meanings that are obvious to one of ordinary skill in the art. However, the terms may have different meanings according to the intention of one of ordinary skill in the art, precedent cases, or the appearance of new technologies. Also, some terms may be arbitrarily selected by the applicant, and in this case, the meaning of the selected terms will be described in detail in the detailed description of the inventive concept. Thus, the terms used herein have to be defined based on the meaning of the terms together with the description throughout the specification.

When a part "includes" or "comprises" an element, unless there is a particular description contrary thereto, the part can further include other elements, not excluding the other elements. Also, the term "unit" in the embodiments of the present inventive concept means a software component or hardware component such as a field-programmable gate array (FPGA) or an application-specific integrated circuit (ASIC), and performs a specific function. However, the term "unit" is not limited to software or hardware. The "unit" may be formed so as to be in an addressable storage medium, or may be formed so as to operate one or more processors. Thus, for example, the term "unit" may refer to components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and "units" may be associated with the smaller number of components and "units", or may be divided into additional components and "units".

Reference will now be made in detail to embodiments, examples of which are illustrated in the accompanying drawings. In this regard, the present embodiments may have different forms and should not be construed as being limited to the descriptions set forth herein. In the following description, well-known functions or constructions are not described in detail so as not to obscure the embodiments with unnecessary detail.

In the present specification, an "image" may refer to multi-dimensional data composed of discrete image elements (e.g., pixels in a two-dimensional (2D) image and voxels in a three-dimensional (3D) image). For example, the image may be a medical image of an object captured by an X-ray apparatus, a computed tomography (CT) apparatus, a magnetic resonance imaging (MRI) apparatus, an ultrasound diagnosis apparatus, or another medical imaging apparatus.

Furthermore, in the present specification, an "object" may be a human, an animal, or a part of a human or animal. For example, the object may be an organ (e.g., the liver, the heart, the womb, the brain, a breast, or the abdomen), a blood vessel, or a combination thereof. Furthermore, the "object" may be a phantom. The phantom means a material having a density, an effective atomic number, and a volume that are approximately the same as those of an organism. For example, the phantom may be a spherical phantom having properties similar to the human body.

Furthermore, in the present specification, a "user" may be, but is not limited to, a medical expert, such as a medical doctor, a nurse, a medical laboratory technologist, or a technician who repairs a medical apparatus.

Furthermore, in the present specification, an "MR image" refers to an image of an object obtained by using the nuclear magnetic resonance principle.

Furthermore, in the present specification, a "pulse sequence" refers to continuity of signals repeatedly applied by an MRI apparatus. The pulse sequence may include a time parameter of a radio frequency (RF) pulse, for example, repetition time (TR) or echo time (TE).

Furthermore, in the present specification, a "pulse sequence schematic diagram" shows an order of events that occur in an MRI apparatus. For example, the pulse sequence schematic diagram may be a diagram showing an RF pulse, a gradient magnetic field, an MR signal, or the like according to time.

An MRI apparatus is an apparatus for acquiring a sectional image of a part of an object by expressing, in a contrast comparison, a strength of a MR signal with respect to a radio frequency (RF) signal generated in a magnetic field having a specific strength. For example, if an RF signal that only resonates a specific atomic nucleus (for example, a hydrogen atomic nucleus) is emitted for an instant toward the object placed in a strong magnetic field and then such emission stops, an MR signal is emitted from the specific atomic nucleus, and thus the MRI apparatus may receive the MR signal and acquire an MR image. The MR signal denotes an RF signal emitted from the object. An intensity of the MR signal may be determined according to a density of a predetermined atom (for example, hydrogen) of the object, a relaxation time T1, a relaxation time T2, and a flow of blood or the like.

MRI apparatus include characteristics different from those of other imaging apparatuses. Unlike imaging apparatuses such as CT apparatuses that acquire images according to a direction of detection hardware, MRI apparatus may acquire 2D images or 3D volume images that are oriented toward an optional point. MRI apparatus do not expose objects or examiners to radiation, unlike CT apparatuses, X-ray apparatuses, position emission tomography (PET) apparatuses, and single photon emission CT (SPECT) apparatuses, may acquire images having high soft tissue contrast, and may acquire neurological images, intravascular images, musculoskeletal images, and oncologic images that are required to precisely capturing abnormal tissues.

FIG. 1 is a block diagram of a general MRI apparatus.

Referring to FIG. 1, the general MRI apparatus may include a gantry 20, a signal transceiver 30, a monitoring unit 40, a system control unit 50, and an operating unit 60.

The gantry 20 prevents external emission of electromagnetic waves generated by a main magnet 22, a gradient coil 24, and an RF coil 26. A magnetostatic field and a gradient magnetic field are formed in a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform.

The gradient coil 24 includes X, Y, and Z coils for generating gradient magnetic fields in X-, Y-, and Z-axis directions crossing each other at right angles. The gradient coil 24 may provide location information of each region of the object 10 by differently inducing resonance frequencies according to the regions of the object 10.

The RF coil 26 may emit an RF signal toward a patient and receive an MR signal emitted from the patient. In detail, the RF coil 26 may transmit, toward atomic nuclei included in the patient and having precessional motion, an RF signal having the same frequency as that of the precessional motion, stop transmitting the RF signal, and then receive an MR signal emitted from the atomic nuclei included in the patient.

For example, in order to transit an atomic nucleus from a low energy state to a high energy state, the RF coil 26 may generate and apply an electromagnetic wave signal that is an RF signal corresponding to a type of the atomic nucleus, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves having a Lamor frequency. In other words, when the applying of the electromagnetic wave signal to the atomic nucleus is stopped, an energy level of the atomic nucleus is changed from a high energy level to a low energy level, and thus the atomic nucleus may emit electromagnetic waves having a Lamor frequency. The RF coil 26 may receive electromagnetic wave signals from atomic nuclei included in the object 10.

The RF coil 26 may be realized as one RF transmitting and receiving coil having both a function of generating electromagnetic waves each having an RF that corresponds to a type of an atomic nucleus and a function of receiving electromagnetic waves emitted from an atomic nucleus. Alternatively, the RF coil 26 may be realized as a transmission RF coil having a function of generating electromagnetic waves each having an RF that corresponds to a type of an atomic nucleus, and a reception RF coil having a function of receiving electromagnetic waves emitted from an atomic nucleus.

The RF coil 26 may be fixed to the gantry 20 or may be detachable. When the RF coil 26 is detachable, the RF coil 26 may be an RF coil for a part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may communicate with an external apparatus via wires and/or wirelessly, and may also perform dual tune communication according to a communication frequency band.

The RF coil 26 may be a transmission exclusive coil, a reception exclusive coil, or a transmission and reception coil according to methods of transmitting and receiving an RF signal.

The RF coil 26 may be an RF coil having various numbers of channels, such as 16 channels, 32 channels, 72 channels, and 144 channels.

The gantry 20 may further include a display 29 disposed outside the gantry 20 and a display (not shown) disposed inside the gantry 20. The gantry 20 may provide predetermined information to the user or the object 10 through the display 29 and the display respectively disposed outside and inside the gantry 20.

The signal transceiver 30 may control the gradient magnetic field formed inside the gantry 20, i.e., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-, Y-, and Z-axis directions may be synthesized.

The RF transmitter 36 and the RF receiver 38 may drive the RF coil 26. The RF transmitter 36 may supply an RF pulse in a Lamor frequency to the RF coil 26, and the RF receiver 38 may receive an MR signal received by the RF coil 26.

The transmission and reception switch 34 may adjust transmitting and receiving directions of the RF signal and the MR signal. For example, the transmission and reception switch 34 may emit the RF signal toward the object 10 through the RF coil 26 during a transmission mode, and receive the MR signal from the object 10 through the RF coil 26 during a reception mode. The transmission and reception switch 34 may be controlled by a control signal output by an RF controller 56.

The monitoring unit 40 may monitor or control the gantry 20 or devices mounted on the gantry 20. The monitoring unit 40 may include a system monitoring unit 42, an object monitoring unit 44, a table controller 46, and a display controller 48.

The system monitoring unit 42 may monitor and control a state of the magnetostatic field, a state of the gradient magnetic field, a state of the RF signal, a state of the RF coil 26, a state of the table 28, a state of a device measuring body information of the object 10, a power supply state, a state of a thermal exchanger, and a state of a compressor.

The object monitoring unit 44 monitors a state of the object 10. In detail, the object monitoring unit 44 may include a camera for observing a movement or position of the object 10, a respiration measurer for measuring the respiration of the object 10, an electrocardiogram (ECG) measurer for measuring the electrical activity of the object 10, or a temperature measurer for measuring a temperature of the object 10.

The table controller 46 controls a movement of the table 28 where the object 10 is positioned. The table controller 46 may control the movement of the table 28 according to a sequence control of a sequence controller 52. For example, during moving imaging of the object 10, the table controller 46 may continuously or discontinuously move the table 28 according to the sequence control of the sequence controller 52, and thus the object 10 may be photographed in a field of view (FOV) larger than that of the gantry 20.

The display controller 48 controls the display 29 disposed outside the gantry 20 and the display disposed inside the gantry 20. In detail, the display controller 48 may control the display 29 and the display to be on or off, and may control a screen image to be output on the display 29 and the display. Also, when a speaker is located inside or outside the gantry 20, the display controller 48 may control the speaker to be on or off, or may control sound to be output via the speaker.

The system control unit 50 may include the sequence controller 52 for controlling a sequence of signals formed in the gantry 20, and a gantry controller 58 for controlling the gantry 20 and the devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating unit 60. Here, the pulse sequence includes all information required to control the gradient amplifier 32, the RF transmitter 36, the RF receiver 38, and the transmission and reception switch 34. For example, the pulse sequence may include information about a strength, an application time, and application timing of a pulse signal applied to the gradient coil 24.

The operating unit 60 may request the system control unit 50 to transmit pulse sequence information while controlling an overall operation of the MRI apparatus.

The operating unit 60 may include an image processor 62 for receiving and processing the MR signal received by the RF receiver 38, an output unit 64, and an input unit 66.

The image processor 62 may process the MR signal received from the RF receiver 38 so as to generate MR image data of the object 10.

The image processor 62 receives the MR signal received by the RF receiver 38 and performs any one of various signal processes, such as amplification, frequency transformation, phase detection, low frequency amplification, and filtering, on the received MR signal.

The image processor 62 may arrange digital data in a k-space (for example, also referred to as a Fourier space or a frequency space) of a memory, and rearrange the digital data into image data via 2D or 3D Fourier transformation.

A k-space is a set of raw data for an MR signal, and may include position information and contrast information.

Digital data arranged in a k-space may be undersampled data, and thus data are missing in some rows of the k-space.

The image processor 62 may perform a composition process or difference calculation process on image data if required. The composition process may include an addition process on a pixel or a maximum intensity projection (MIP) process. The image processor 62 may store not only the rearranged image data but also image data on which a composition process or a difference calculation process is performed, in a memory (not shown) or an external server.

The image processor 62 may perform any of the signal processes on the MR signal in parallel. For example, the image processor 62 may perform a signal process on a plurality of MR signals received by a multi-channel RF coil in parallel so as to rearrange the plurality of MR signals into image data.

The output unit 64 may output image data generated or rearranged by the image processor 62 to the user. The output unit 64 may also output information required for the user to manipulate the MRI apparatus, such as a user interface (UI), user information, or object information. The output unit 64 may be a speaker, a printer, a cathode-ray tube (CRT) display, a liquid crystal display (LCD), a plasma display panel (PDP), an organic light-emitting device (OLED) display, a field emission display (FED), a light-emitting diode (LED) display, a vacuum fluorescent display (VFD), a digital light processing (DLP) display, a flat panel display (FPD), a 3-dimensional (3D) display, a transparent display, or any one of other various output devices that are well known to one of ordinary skill in the art.

The user may input object information, parameter information, a scan condition, a pulse sequence, or information about image composition or difference calculation by using the input unit 66. The input unit 66 may be a keyboard, a mouse, a track ball, a voice recognizer, a gesture recognizer, a touch screen, or any one of other various input devices that are well known to one of ordinary skill in the art.

The signal transceiver 30, the monitoring unit 40, the system control unit 50, and the operating unit 60 are separate components in FIG. 1, but it will be obvious to one of ordinary skill in the art that respective functions of the signal transceiver 30, the monitoring unit 40, the system control unit 50, and the operating unit 60 may be performed by another component. For example, the image processor 62 converts the MR signal received from the RF receiver 38 into a digital signal in FIG. 1, but alternatively, the conversion of the MR signal into the digital signal may be performed by the RF receiver 38 or the RF coil 26.

The gantry 20, the RF coil 26, the signal transceiver 30, the monitoring unit 40, the system control unit 50, and the operating unit 60 may be connected to each other by wire or wirelessly, and when they are connected wirelessly, the MRI apparatus may further include an apparatus (not shown) for synchronizing clock signals therebetween. Communication between the gantry 20, the RF coil 26, the signal transceiver 30, the monitoring unit 40, the system control unit 50, and the operating unit 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, or any of other various communication methods that are well known to one of ordinary skill in the art.

Figure 2:
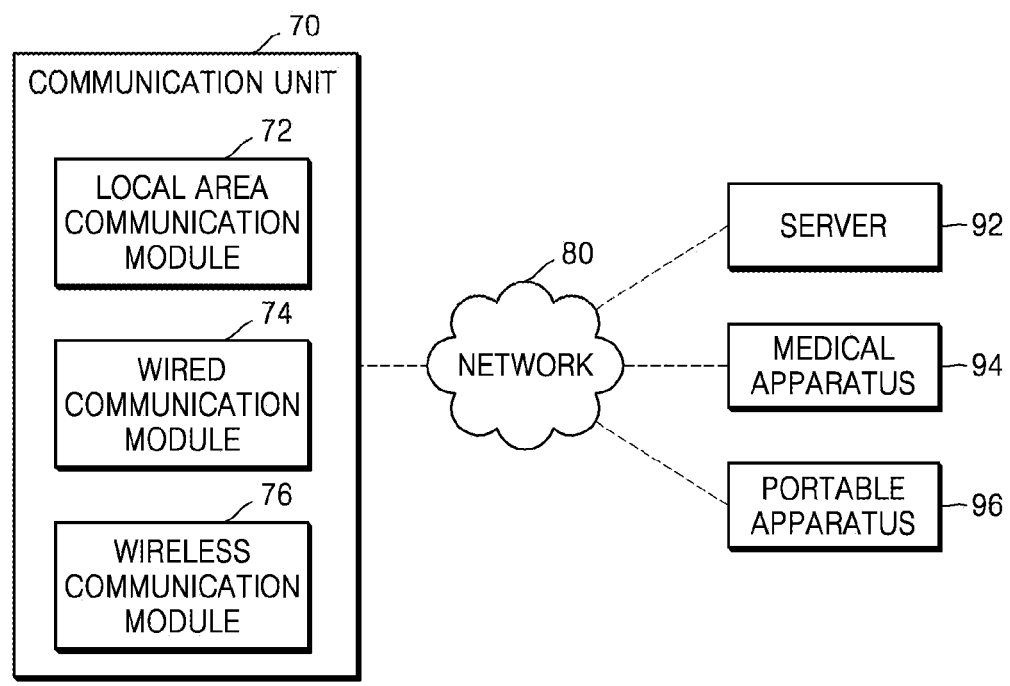
FIG. 2 illustrates a communication unit according to an exemplary embodiment.

FIG. 2 is a block diagram of a communication unit 70 according to an embodiment of the present inventive concept. Referring to FIG. 2, the communication unit 70 may be connected to at least one selected from the gantry 20, the signal transceiver 30, the monitoring unit 40, the system control unit 50, and the operating unit 60 of FIG. 1.

The communication unit 70 may transmit and receive data to and from a hospital server or another medical apparatus in a hospital, which is connected through a picture archiving and communication system (PACS), and perform data communication according to the digital imaging and communications in medicine (DICOM) standard.

As shown in FIG. 2, the communication unit 70 may be connected to a network 80 by wire or wirelessly to communicate with a server 92, a medical apparatus 94, or a portable device 96.

In detail, the communication unit 70 may transmit and receive data related to the diagnosis of an object through the network 80, and may also transmit and receive a medical image captured by the medical apparatus 94, such as a CT apparatus, an MRI apparatus, or an X-ray apparatus. In addition, the communication unit 70 may receive a diagnosis history or a treatment schedule of the object from the server 92 and use the same to diagnose the object. The communication unit 70 may perform data communication not only with the server 92 or the medical apparatus 94 in a hospital, but also with the portable device 96, such as a mobile phone, a personal digital assistant (PDA), or a laptop of a doctor or patient.

Also, the communication unit 70 may transmit information about a malfunction of the MRI apparatus or about a medical image quality to a user through the network 80, and receive a feedback regarding the information from the user.

The communication unit 70 may include at least one component enabling communication with an external apparatus.

For example, the communication unit 70 may include a local area communication module 72, a wired communication module 74, and a wireless communication module 76. The local area communication module 72 refers to a module for performing local area communication with an apparatus within a predetermined distance. Examples of local area communication technology according to an embodiment of the present inventive concept include, but are not limited to, a wireless local area network (LAN), Wi-Fi, Bluetooth, ZigBee, Wi-Fi direct (WFD), ultra wideband (UWB), infrared data association (IrDA), Bluetooth low energy (BLE), and near field communication (NFC).

The wired communication module 74 refers to a module for performing communication by using an electric signal or an optical signal. Examples of wired communication technology according to an embodiment of the present inventive concept include wired communication techniques using a pair cable, a coaxial cable, and an optical fiber cable, and other well-known wired communication techniques.

The wireless communication module 76 transmits and receives a wireless signal to and from at least one selected from a base station, an external apparatus, and a server in a mobile communication network. Here, the wireless signal may be a voice call signal, a video call signal, or data in any one of various formats according to transmission and reception of a text/multimedia message.

Figure 3:
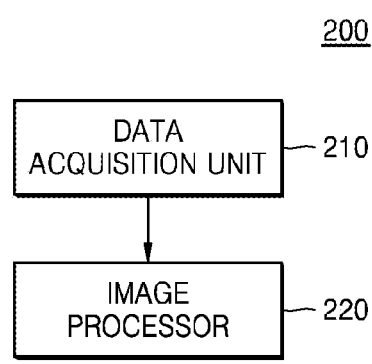
FIG. 3 is a block diagram of an MRI apparatus according to an exemplary embodiment.

FIG. 3 is a block diagram of an MRI apparatus according to an exemplary embodiment.

Referring to FIG. 3, the MRI apparatus 200 according to the present embodiment may include a data acquisition unit 210 and an image processor 220.

The data acquisition unit 210 shown in FIG. 3 may correspond to the RF receiver 38 or operating unit 60, and the image processor 220 shown in FIG. 3 may correspond to the image processor 62 shown in FIG. 1.

The data acquisition unit 210 may acquire a plurality of k-space data by sampling MR signals at different time points. For example, the data acquisition unit 210 may sample MR signals at first through third time points to obtain first through third k-space data, respectively.

In this case, the data acquisition unit 210 may acquire k-space data including a missing line by performing undersampling on an MR signal corresponding to a k-space.

According to an exemplary embodiment, the data acquisition unit 210 may acquire first k-space data including a first missing line by undersampling an MR signal at a first time point. The data acquisition unit 210 may also acquire second k-space data including a first acquired line corresponding to the first missing line of a first k-space by undersampling an MR signal at a second time point. The data acquisition unit 210 may also acquire third k-space data including a second acquired line corresponding to the first missing line in the first k-space by undersampling an MR signal at a third time point.

Furthermore, the data acquisition unit 210 may acquire a plurality of k-space data including different MR parameters. For example, the data acquisition unit 210 may set differently MR parameters such as TR, Flip Angle (FA), and Inversion Time (TI), and acquire data by sampling MR signals.

The image processor 220 may interpolate data in an unsampled, missing line based on k-space data acquired by the data acquisition unit 210.

For example, the image processor 220 may interpolate data in a first missing line of a first k-space by using data in a first acquired line of a second k-space corresponding to the first missing line and data in a second acquired line of a third k-space corresponding to the first missing line. In this case, the image processor 220 may calculate weights for the second and third k-spaces and interpolate data in the first missing line of the first k-space by applying the calculated weights.

Furthermore, the image processor 220 may perform 2D or 3D Fourier transformation on interpolated k-space data to generate an MR image.

Figure 4:
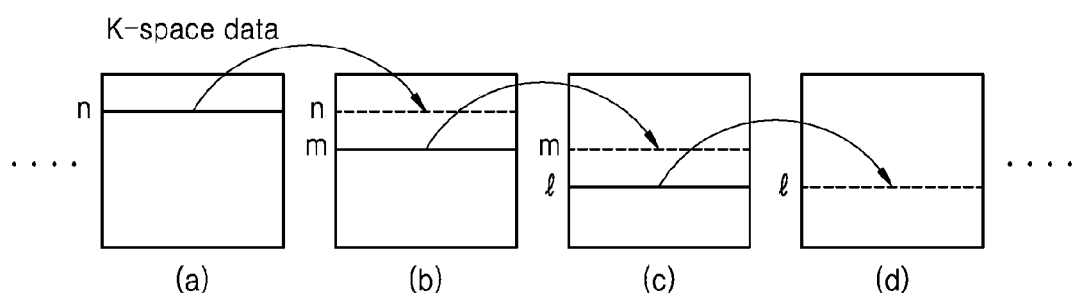
FIG. 4 is a diagram for explaining a method of sharing data between adjacent undersampled k-space data.

FIG. 4 is a diagram for explaining a method of sharing data between adjacent undersampled k-space data.

FIG. 4 illustrates, in (a), (b), (c) and (d), k-space data produced by arranging MR signal data acquired from a moving object over time. Hereinafter, for convenience of explanation, k-space data shown in (a) through (d) of FIG. 4 are referred to as first through fourth k-space data, respectively.

Furthermore, the first through fourth k-space data may be k-space data obtained by undersampling MR signals acquired over time continuously. For example, if the first k-space data is obtained by undersampling an MR signal at an n-th time point, the second through fourth k-space data may be obtained by undersampling MR signals at n+1-th through n+3-th time points, respectively, but are not limited thereto Furthermore, each of the first through fourth k-space data may include a missing line in which an MR signal is not measured.

For example, an n-th line in the first k-space data may be an acquired line in which an MR signal is measured (hereinafter, referred to as an 'acquired line') while an n-th line in the second k-space data may be a missing line in which an MR signal is not measured (hereinafter, referred to as a 'missing line'). Furthermore, an m-th line in the second k-space data may be an acquired line, whereas an m-th line in the third k-space data may be a missing line. An l-th line in the third k-space data may be an acquired line while an l-th line in the fourth k-space data may be a missing line.

To generate an MR image by using undersampled k-space data, the image processor (220 in FIG. 3) may share the first through fourth k-space data and interpolate missing lines thereof.

For example, data in the missing n-th line of the second k-space may be filled in by using data in the n-th line of the first k-space. Furthermore, data in the missing m-th line of the third k-space may be filled in by using data in the m-th line of the second k-space. Similarly, data in the missing l-th line of the third k-space may be filled in by using data in the l-th line of the third k-space.

If there is a small difference in contrast between temporally adjacent images (e.g., like in dynamic MRI), as described above, data in an empty line (missing line) of a current k-space may be filled in by using adjacent k-space data.

On the other hand, if there is a large difference in contrast between images corresponding to adjacent k-space data, as described above, an MR image may be generated by interpolating data in a missing line of a current k-space based on data in an adjacent k-space. In this case, the quality of the MR image may be degraded.

For example, if an MR signal is acquired by arbitrarily changing MR parameters such as TR and FA, or if excessive undersampling is performed, interpolating data in a missing line of a current k-space by using data in an adjacent k-space may not be suitable.

Figure 5:
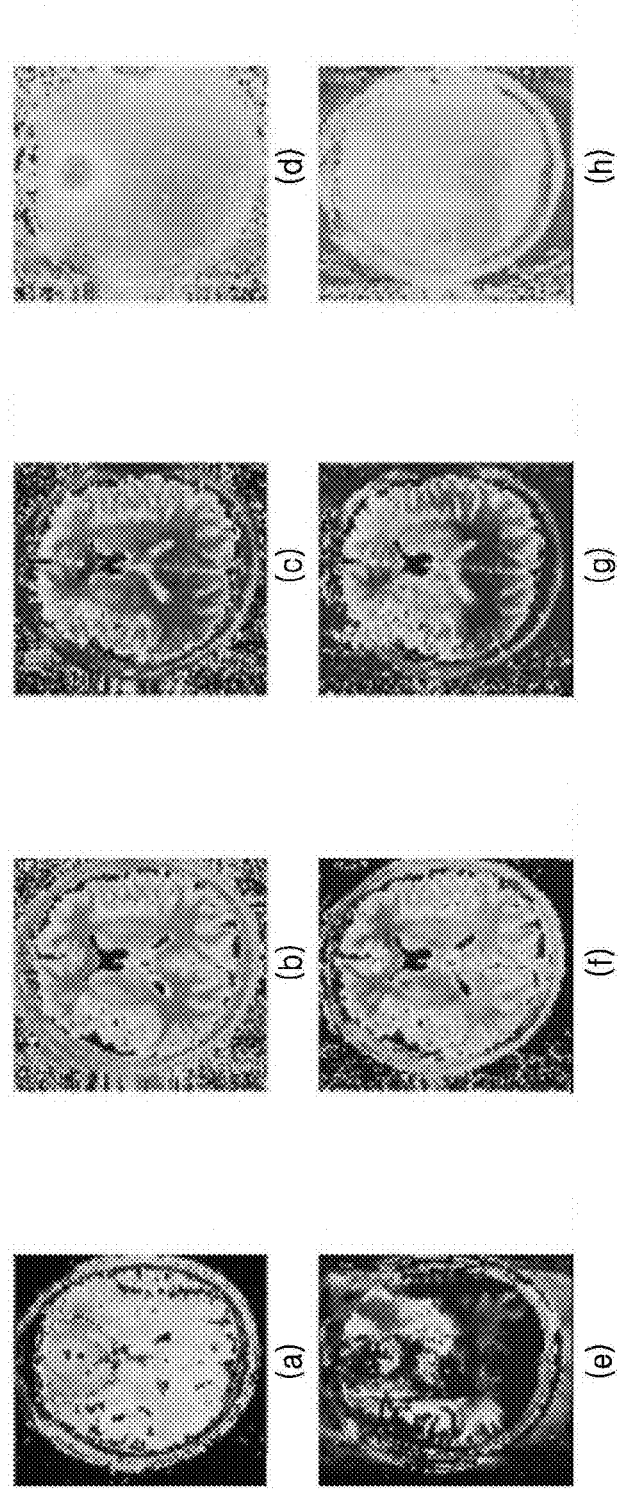
FIG. 5 illustrates, in (a), (b), (c) and (d), MR images generated using fully sampled data, and illustrates, in (e), (f), (g), and (h), MR images generated by applying the method of FIG. 4 to undersampled data.

FIG. 5 illustrates, in (a), (b), (c) and (d), MR images generated using fully sampled data, i.e., an enhanced M0 image, an enhanced T1 image, an enhanced T2 image, and an enhanced ΔB (magnetic field inhomogeneity) image, respectively. FIG. 5 illustrates, in (e), (f), (g) and (h), MR images generated by applying the method illustrated in FIG. 4 to undersampled data if excessive undersampling is performed. The MR images illustrated in (e) through (h) of FIG. 5 correspond to the MR images illustrated in (a) through (d) of FIG. 5, respectively.

The MR images generated based on the method of FIG. 4 as shown in (e) through (h) of FIG. 5 are quite different from the MR images generated using fully sampled data as shown in (a) through (d) of FIG. 5.

Figure 6:
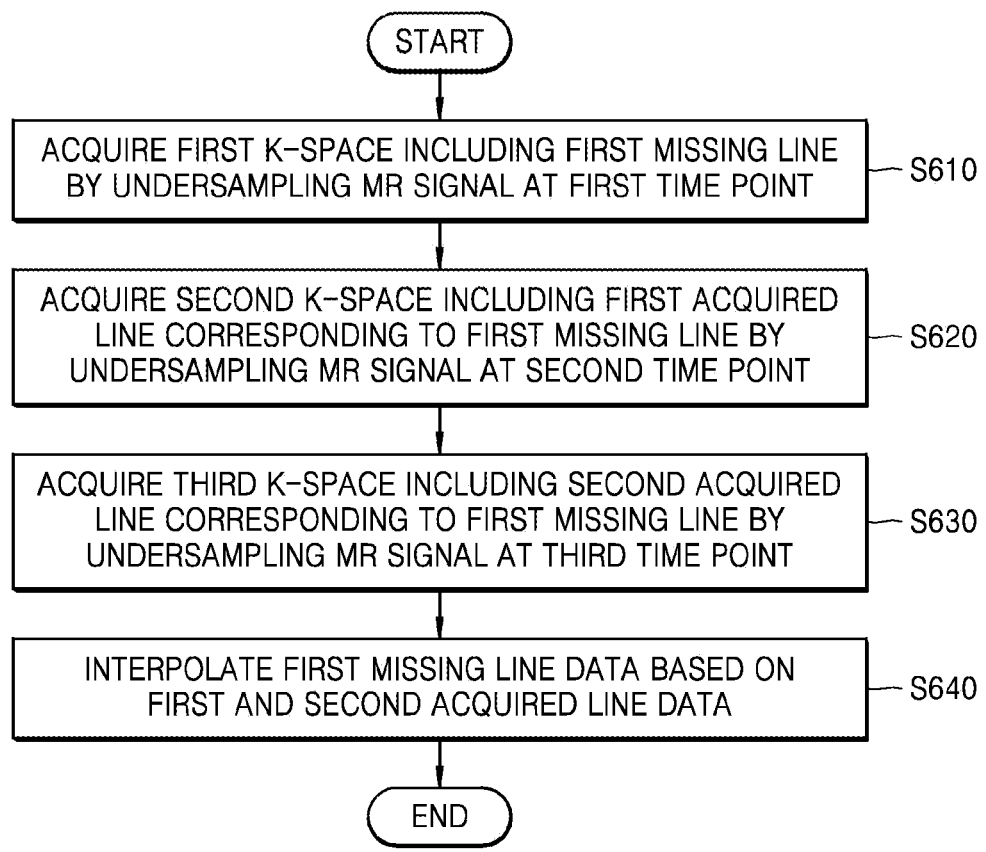
FIG. 6 is a flowchart of a method of operating an MRI apparatus according to an exemplary embodiment.

FIG. 6 is a flowchart of a method of operating an MRI apparatus according to an exemplary embodiment.

Referring to FIG. 6, the MRI apparatus (100 of FIG. 1 or 200 of FIG. 3) may undersample an MR signal received from an object at a first time point to acquire first k-space data including a first missing line (610).

Furthermore, the MRI apparatus 100 or 200 may undersample an MR signal from the object at a second time point to acquire second k-space data (S620). In this case, the second k-space data may include a first acquired line corresponding to the first missing line of the first k-space.

The MRI apparatus 100 or 200 may then undersample an MR signal from the object at a third time point to acquire third k-space data (S630). In this case, the third k-space data may include a second acquired line corresponding to the first missing line of the first k-space.

The MRI apparatus 100 or 200 may interpolate data in the first missing line based on data in the first and second acquired lines of second and third k-spaces, respectively (S640).

The method of FIG. 6 will now be described in greater detail with reference to FIG. 7.

Figure 7:
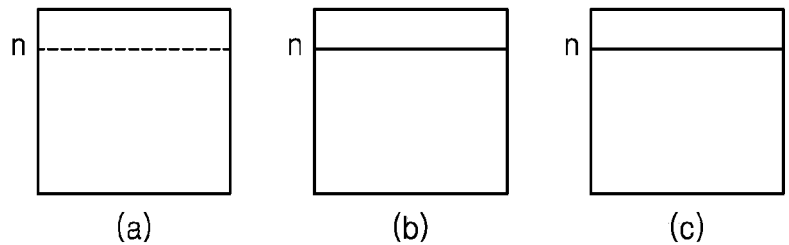
FIG. 7 is a diagram for explaining a method of sharing data between adjacent undersampled k-space data according to an exemplary embodiment.

FIG. 7 is a diagram for explaining a method of sharing data between adjacent undersampled k-space data according to an exemplary embodiment.

In detail, FIG. 7 illustrates, in (a), (b) and (c), k-space data acquired by undersampling MR signals at different time points, e.g., first through third k-space data acquired by undersampling MR signals at first through third time points, respectively.

The first through third k-space data may be k-space data acquired based on different MR parameters. In this case, the MR parameters may include an FA, a TR, etc. The FA may be influenced by adjustment factors and various properties such as an RF coil and an RF pulse shape and may change the contrast of an image. The TR is the time interval between two consecutive 90° RF pulses used for obtaining first and next echo signals (MR signals). The MR parameters may not be limited to the FA and TR, but further include other parameters.

Referring to (a) through (c) of FIG. 7, if an n-th line of a first k-space is a missing line (an MR signal corresponding to the n-th line is not sampled), the MRI apparatus 100 or 200 may interpolate unsampled, missing line data based on the remaining k-space data.

For example, the unsampled n-th line data (the missing line data) in the first k-space may be interpolated based on sampled n-th line data (acquired line data) in a second k-space and sampled n-th line data (acquired line data) in a third k-space.

Although (a) through (c) of FIG. 7 illustrate the method of sharing data between three k-space data, the MRI apparatus 100 or 200 may undersample MR signals to obtain n k-spaces, unsampled m-th line data in an arbitrary k-space may be interpolated based on sampled m-th line data in each of the remaining n−1 k-spaces.

Furthermore, as shown in (a) through (c) of FIG. 7, the MRI apparatus 100 or 200 may apply weights for the respective second and third k-spaces when interpolating the missing line data in the first k-space by using the acquired line data in the second and third k-space data.

In this case, the weights applied to the respective second and third k-spaces may be represented by coefficients $c_2$ and $c_3$, respectively. Furthermore, a weight for each k-space may be calculated based on data in a center line of the k-space.

The center line of the k-space mostly includes a low frequency component, and a magnitude of a signal may not change greatly according to MR parameters. Thus, calculating a weight for each k-space based on center line data in the k-space may increase accuracy of interpolated data.

If the number of undersampled k-spaces is n, to acquire unsampled missing line data x in one of the n k-spaces, the MRI apparatus 100 or 200 may calculate a weight for each of the remaining n−1 k-spaces.

For example, the MRI apparatus 100 or 200 may calculate a weight by using an Orthogonal Matching Pursuit (OMP) algorithm as defined in Equation (1) below. For convenience of explanation, the remaining n−1 k-spaces are denoted by f1 through f(n−1).

$$\arg\min\_\{c1,\ldots,n{-}1\}d(v0, \sum\{i{=}1,\ldots,n{-}1\}ci^*vi) \quad (1)$$

where ci denotes a weight (coefficient) of a k-space fi, and vi denotes center line data in the k-space fi.

In detail, since ky=0 in the center line data (kx, ky) in the k-space fi, the center line data has only a value of kx, and vi means kx. d(v, w) represents an error between two vectors v and w.

Thus, weights ci may be calculated that minimize a difference (error) between center line data v0 in a k-space f0 and a value obtained by performing linear interpolation of center line data vi in each of the remaining n−1 k-spaces, and the calculated weights ci may be used as weights for the respective k-spaces fi.

However, a method of calculating a weight for each k-space is not limited thereto, and a weight for each k-space may be calculated based on data in a line of the k-space that is selected other than a center line.

As described above, after calculating a weight for each k-space, missing line data x in an arbitrary k-space f0 may be obtained using Equation (2) below:

$$x=\text{sum}\_\{i=1\ldots 30\}ci^*xi \quad (2)$$

Furthermore, weights (coefficients) calculated using Equation (1) may be applied in the same manner when obtaining another missing line data in the arbitrary k-space f0.

Figure 8:
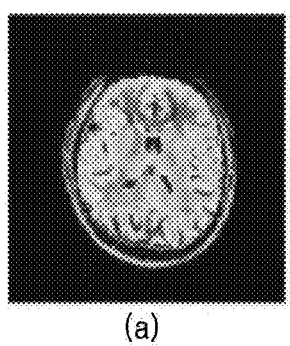
FIG. 8 illustrates, in (a), an MR image generated using fully sampled data, in (b), an MR image generated by applying a method of sharing data according to an exemplary embodiment, and in (c), a differential image between the MR images shown in (a) and (b) of FIG. 8.
Figure 8:
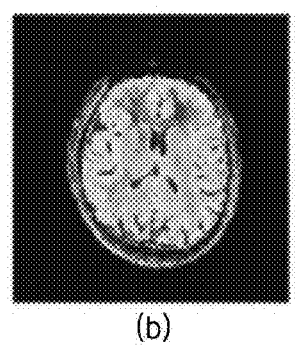
Figure 8:
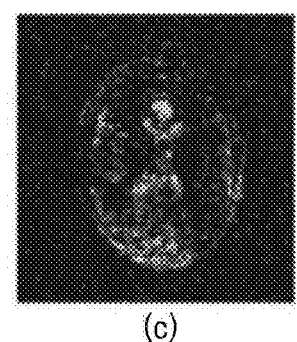

FIG. 8 illustrates, in (a), an MR image generated using fully sampled data, FIG. 8 illustrates, in (b), an MR image generated by applying the method of FIG. 7, and FIG. 8 illustrates, in (c), a differential image between the MR images shown in (a) and (b) of FIG. 8, respectively.

For example, as described above, to obtain unsampled k-space data (missing line data) among undersampled k-space data, the MRI apparatus 100 or 200 may perform linear interpolation by assigning weights to sampled data in the remaining k-spaces. Thus, the MRI apparatus 100 or 200 may acquire unsampled k-space data and generate an MR image as shown in (b) of FIG. 8 based on the unsampled k-space data.

As evident from (c) of FIG. 8, the difference between the fully sampled MR image of (a) of FIG. 8A and the MR image of (b) of generated by using the method of FIG. 7 is very slight.

Figure 9:
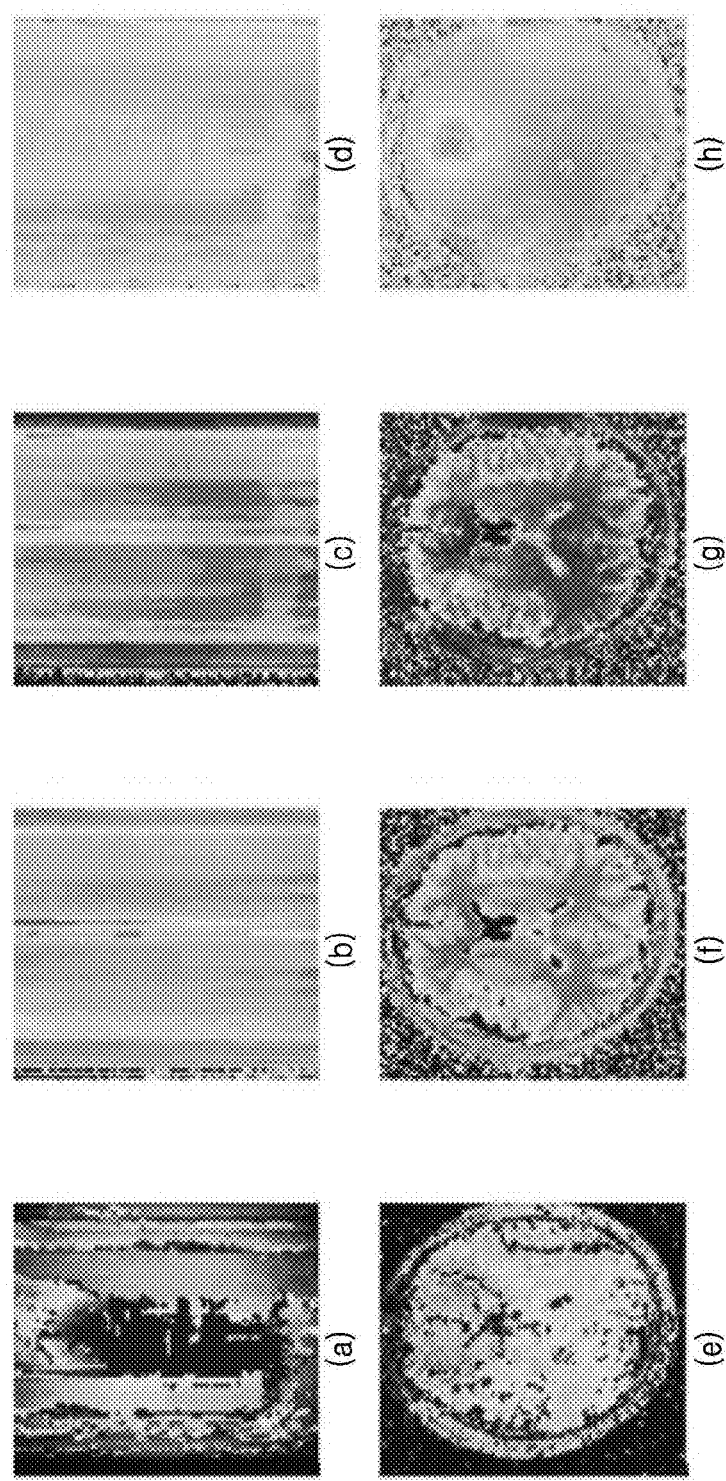
FIG. 9 illustrates, in (a), (b), (c) and (d), MR images generated without applying a method of sharing data to undersampled k-space data, and illustrates, in (e), (f), (g) and (h), MR images generated by applying the method illustrated in FIGS. 6 and 7 to undersampled k-space data.

FIG. 9 illustrates, in (a), (b), (c) and (d), MR images generated without applying a method of sharing data to undersampled k-space data, i.e., an enhanced M0 image, an enhanced T1 image, an enhanced T2 image, and an enhanced ΔB image, respectively.

FIG. 9 illustrates, in (e), (f), (g) and (h), MR images generated by applying the method of interpolating missing line data (the method of sharing data) according to the exemplary embodiment described with reference to FIGS. 6 and 7 to undersampled k-space data. Similarly to (a) through (d) of FIG. 9, (e) through (h) of FIG. 9 illustrate an enhanced M0 image, an enhanced T1 image, an enhanced T2 image, and an enhanced ΔB image, respectively.

Referring to (a) through (h) of FIG. 9, when an MR image is generated by using the method of interpolating missing line data (the method of sharing data) according to the exemplary embodiment, the accuracy and resolution of the MR image may be increased.

Figure 10:
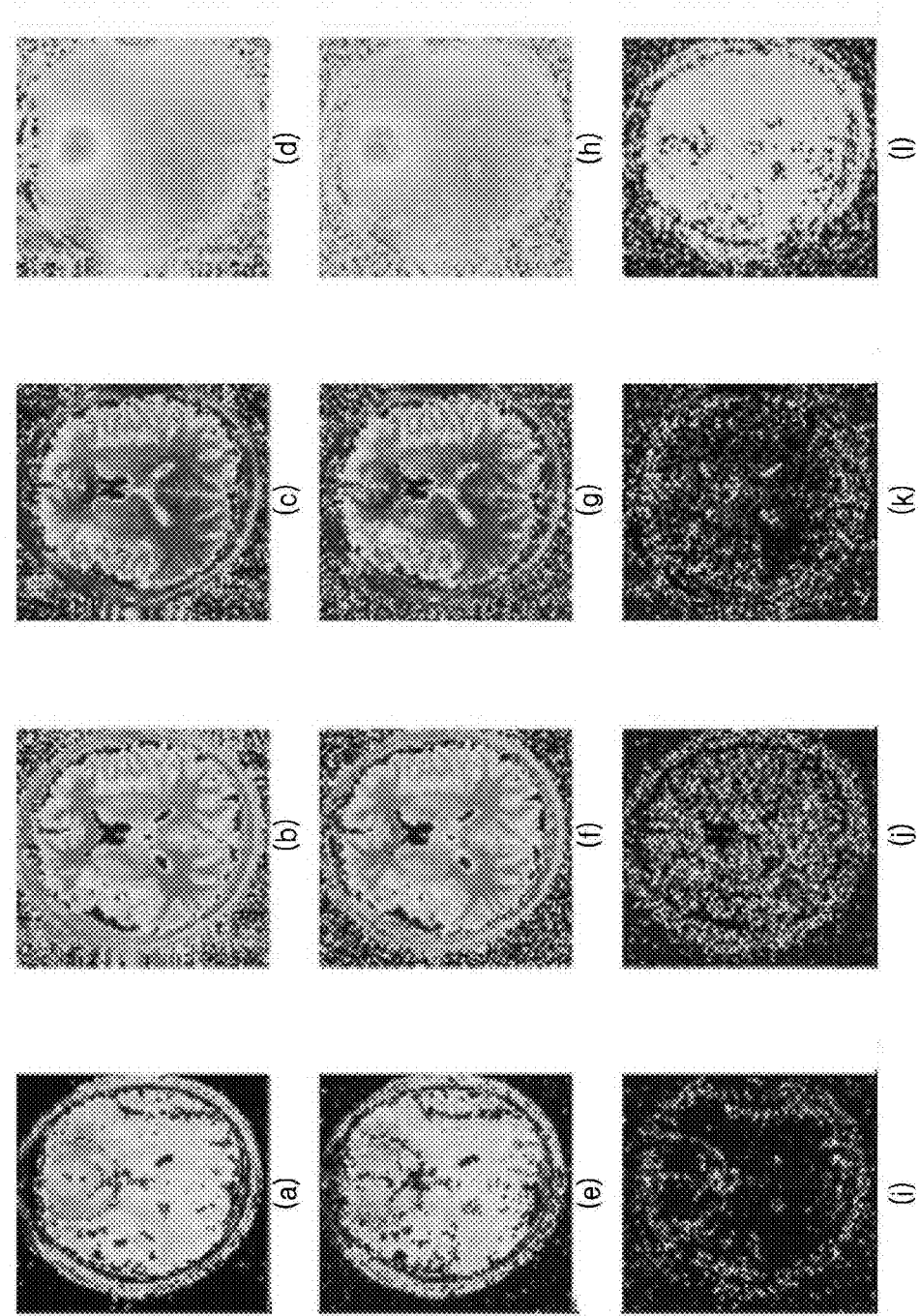
FIG. 10 illustrates, in (a), (b), (c), and (d), MR images generated based on fully sampled data, illustrates, in (e), (f), (g) and (h), MR images generated by applying the method described with reference to FIGS. 6 and 7 to undersampled k-space data, and illustrates, in (i), (j), (k), and (l), differential images between the MR images shown in (a) and (e) of FIG. 10, between the MR images shown in (b) and (f) of FIG. 10, between the MR images shown in (c) and (g) of FIG. 10, and between the MR images shown in (d) and (h) of FIG. 10, respectively.

FIG. 10 illustrates, in (a), (b), (c) and (d), MR images generated based on fully sampled data, i.e., an enhanced M0 image, an enhanced T1 image, an enhanced T2 image, and an enhanced ΔB image, respectively.

FIG. 10 illustrates, in (e), (f), (g) and (h), MR images generated by applying the method of interpolating missing line data (the method of sharing data) according to the exemplary embodiment described with reference to FIGS. 6 and 7 to undersampled k-space data, i.e., an enhanced M0 image, an enhanced T1 image, an enhanced T2 image, and an enhanced ΔB image, respectively.

FIG. 10 illustrates, in (i), (j), (k) and (l), differential images between the MR images shown in (a) and (e) of FIG. 10, between the MR images shown in (b) and (f) of FIG. 10, between the MR images shown in (c) and (g) of FIG. 10, and between the MR images shown in (d) and (h) of FIG. 10, respectively.

Referring to (i) through (l) of FIG. 10, if an MR image is generated using a method of sharing data according to an exemplary embodiment, the MR image may be similar to that generated based on fully sampled data even when excessive undersampling is performed, and thus, the accuracy of the MR image may be increased.

The methods of operating an MRI apparatus according to the exemplary embodiments may be embodied as a computer-readable code on a computer-readable storage medium in the MRI apparatus. The computer-readable storage medium is any data storage device that can store data which can be thereafter read by a processor. Examples of computer-readable storage media include read-only memory (ROM), random-access memory (RAM), CD-ROMs, magnetic tapes, floppy disks, optical data storage devices, etc. The computer-readable storage media can also be distributed over network coupled computer systems so that computer-readable codes are stored and executed in a distributed fashion.

While one or more exemplary embodiments have been described with reference to the figures, it will be understood by one of ordinary skill in the art that various changes in form and details may be made therein without departing from the spirit and scope of the present inventive concept as defined by the following claims. That is, all changes and modifications within the scope of the appended claims and their equivalents will be construed as being included in the present inventive concept.

What is claimed is:

1. A magnetic resonance imaging (MRI) apparatus comprising:
a data acquisition unit configured to acquire a first k-space including a first missing line by undersampling an MR signal received from an object at a first time point, acquire a second k-space including a first acquired line corresponding to the first missing line by undersampling an MR signal received from the object at a second time point, and acquire a third k-space including a second acquired line corresponding to the first missing line by undersampling an MR signal received from the object at a third time point; and an image processor configured to calculate weights for the second and third k-spaces based on n-th line data in the first k-space, n-th line data in the second k-space, and n-th line data in the third k-space and interpolate data in the first missing line based on data in the first and second acquired lines and the calculated weights for the second and third k-spaces.

2. The MRI apparatus of claim 1, wherein the n-th line data in the first through third k-spaces are center line data therein.

3. The MRI apparatus of claim 2, wherein the image processor calculates the weights for the second and third k-spaces by applying an Orthogonal Matching Pursuit (OMP) algorithm to the center line data in the first through third k-spaces.

4. The MRI apparatus of claim 1, wherein the data acquisition unit acquires the first through third k-space based on first through third values of an MR parameter, respectively.

5. A method of operating a magnetic resonance imaging (MRI) apparatus, the method comprising:

acquiring a first k-space including a first missing line by undersampling an MR signal received from an object at a first time point;

acquiring a second k-space including a first acquired line corresponding to the first missing line by undersampling an MR signal received from the object at a second time point;

acquiring a third k-space including a second acquired line corresponding to the first missing line by undersampling an MR signal received from the object at a third time point;

calculating weights for the second and third k-spaces based on n-th line data in the first k-space, n-th line data in the second k-space, and n-th line data in the third k-space; and interpolating data in the first missing line based on data in the first and second acquired lines and the calculated weights for the second and third k-spaces.

6. The method of claim 5, wherein the n-th line data in the first through third k-spaces are center line data therein.

7. The method of claim 6, wherein in the calculating of the weights for the second and third k-spaces, the weights for the second and third k-spaces are calculated by applying an Orthogonal Matching Pursuit (OMP) algorithm to the center line data in the first through third k-spaces.

8. The method of claim 5, wherein in the acquiring of the first k-space, the first k-space is acquired based on a first value of an MR parameter, wherein in the acquiring of the second k-space, the second k-space is acquired based on a second value of the MR parameter, and wherein in the acquiring of the third k-space, the third k-space is acquired based on a third value of the MR parameter.

9. A non-transitory computer-readable recording medium having recorded thereon a program for executing the method of claim 5 on a computer.

* * * * *